United States Patent [19]
Ohta et al.

[11] Patent Number: 5,619,069
[45] Date of Patent: Apr. 8, 1997

[54] BIPOLAR DEVICE AND PRODUCTION THEREOF

[75] Inventors: Hiroyuki Ohta, Ibaraki-ken; Hideo Miura, Koshigaya; Hiroo Masuda, Tokyo; Yoichi Tamaki, Kokubunji; Takahide Ikeda, Tokorozawa; Asao Nishimura, Ushiku; Takashi Hashimoto, Ome, all of Japan

[73] Assignee: Hitachi, Ltd., Japan

[21] Appl. No.: 458,655

[22] Filed: Jun. 2, 1995

Related U.S. Application Data

[62] Division of Ser. No. 401,678, Mar. 10, 1995.

[30] Foreign Application Priority Data

Mar. 18, 1994 [JP] Japan ................................ 6-048271

[51] Int. Cl.⁶ ........................................ H01L 23/48
[52] U.S. Cl. ........................ 257/692; 257/690; 257/693
[58] Field of Search .................................. 257/590, 592, 257/593

[56] References Cited

U.S. PATENT DOCUMENTS

| | | | |
|---|---|---|---|
| 4,996,581 | 2/1991 | Hamasaki | 257/592 |
| 5,374,846 | 12/1994 | Takemura | 257/592 |
| 5,444,285 | 8/1995 | Robinson et al. | 257/592 |

FOREIGN PATENT DOCUMENTS

| | | |
|---|---|---|
| 64-36071 | 2/1989 | Japan . |
| 4-188628 | 7/1992 | Japan . |

*Primary Examiner*—Mahshid D. Saadat
*Assistant Examiner*—Valencia Martin Wallace
*Attorney, Agent, or Firm*—Evenson, McKeown, Edwards & Lenahan P.L.L.C.

[57] ABSTRACT

A bipolar device having a level difference between the contact area level of a base electrode and a base region in a silicon substrate, and the contact area level of an emitter electrode and an emitter region in the silicon substrate in the range of 0.03 μm to 0.1 μm by removing undesirable impurities from the emitter region and a predetermined horizontal distance between a sidewall and a device isolation film does not generate dislocation and show good electric characteristics.

14 Claims, 7 Drawing Sheets

BIPOLAR DEVICE AND PRODUCTION THEREOF

This is a divisional of application Ser. No. 08/401,678, filed Mar. 10, 1995.

BACKGROUND OF THE INVENTION

This invention relates to a bipolar device and a process for producing the same, more particularly to a high speed bipolar device suitable for installed in a semiconductor integrated circuit device and a process for production thereof.

A high speed bipolar transistor is disclosed, for example, in Japanese Patent Unexamined Publication (JP-A) No. 4-188628, wherein the bipolar transistor comprises a silicon substrate bottom portion having a reverse conductivity type impurity (hereinafter the word "impurity" is sometimes omitted for simplicity), an epitaxial growth layer having a reverse conductivity type, a device isolation film, an active region, a mono-conductivity type (p- or n-type) high concentration burried layer, a monoconductivity type low concentration layer, a reverse conductivity type (e.g. p-type impurity)-containing base region, a monoconductivity type (e.g. n-type impurity)-containing emitter region, a base electrode containing a reverse conductivity type impurity in high concentration, an interlaminar insulating film, an emitter electrode, a sidewall made of a silicon oxide film, an outer base region having a reverse conductivity type, a silicon substrate bottom portion, a collector electrode and a base wiring. Hereinafter, the term "silicon substrate" includes the epitaxial growth layer, the high concentration burried layer, the low concentration layer, the base region, the emitter region and the outer base region.

In the production of the active region of the bipolar device, a base electrode containing a reverse conductivity type impurity in high concentration and an interlaminar insulating film are first deposited on the active region of the silicon substrate, followed by formation of an opening by selectively removing the base electrode and the interlaminar insulating film using a mask of a photoresist film. After depositing a silicon oxide film thereon, a sidewall made of a silicon oxide film is formed at a side wall of the opening by etching back. Then, using this sidewall and interlaminar insulating film as a mask, a reverse conductivity type impurity and then a monoconductivity type impurity are implanted by ion implantation. After heat treatment, a base region and an emitter region are formed, followed by formation of an emitter electrode in contact with the emitter region.

According to the above-mentioned process, there is a problem in that electric characteristics are easily changed on the surface of the emitter region due to mixing of a reverse conductivity type impurity (e.g. boron, etc.) in addition to a monoconductivity type impurity (e.g. phosphorus, arsenic, etc.) constituting the emitter region.

On the other hand, JP-A-64-36071 discloses a bipolar transistor, wherein a hollow portion surrounded by a sidewall is formed on an emitter region on a genuine base region and neighboring to a base region in the silicon substrate sufficiently deeper than the level of an insulating film formed on the silicon substrate and under a base electrode so as to ensure the connection between the base region and the genuine base region and to effectively avoid collision of the base region and the emitter region. But according to this process, since the difference between the bottom level of the hollow and the level of the bottom of insulating film is so large that generation of dislocation cannot be prevented at the sidewall edge due to an increase of stress in the end portion of the sidewall in contact with the silicon substrate, resulting in degradation of electric characteristics. Further, the increase of stress in this bipolar device structure is remarkable with higher integration, so that the electric characteristics are also degraded remarkably.

SUMMARY OF THE INVENTION

It is an object of the present invention to provide a bipolar device slight in variation of electric characteristics. It is another object of the present invention to provide a bipolar device generating no dislocation and good in electric characteristics. It is a further object of the present invention to provide a bipolar device generating no dislocation even if highly integrated. It is a still further object of the present invention to provide a process for producing such a bipolar device.

The present invention provides a bipolar device comprising a silicon substrate including an epitaxial growth layer, a burried layer, a low-concentration p- or n-type layer, a base region, and an emitter region; an emitter electrode formed in contact with the emitter region and separated from a base electrode, which is formed in contact with the base region, by a sidewall; a device isolation film formed between the base electrode and the silicon substrate and having a distance from the sidewall; and a collector electrode formed in contact with the burried layer; a contact area level between the base electrode and the base region and a contact area level between the emitter electrode and the emitter region having a level difference in the range of 0.03 μm to 0.1 μm by removing p- or n-type impurities from the emitter region.

The present invention also provides a process for producing a bipolar device, which comprises the steps of:

forming a burried layer on a silicon substrate, followed by formation of a low-concentration p- or n-type layer, forming a device isolation layer on the silicon substrate by thermal oxidation, depositing a base electrode and an interlaminar insulating film on a base region in the silicon substrate, forming an opening by partly removing the base electrode and the interlaminar insulating film, followed by removal of the silicon substrate in the opening in a predetermined amount so as to form a level difference finally, and formation of a genuine base layer by ion implantation or thermal diffusion method, forming a sidewall at a side wall, forming an outer base layer as an impurity source in the silicon substrate by heat treatment, forming an emitter region on the base region by ion implantation and subsequent heat treatment after the formation of a polycrystalline silicon film, forming an emitter electrode on the emitter region, and forming a collector electrode in contact with the burried layer.

DESCRIPTION OF THE PREFERRED EMBODIMENTS

The bipolar device of the present invention generating no dislocation and having good electric characteristics can be obtained by making a contact area level between the emitter electrode and the emitter region in the silicon substrate lower than a contact area level between the base electrode and the base region in the silicon substrate. That is, the above-mentioned problem of prior art can be solved by making a proper level difference at the contact area level between the base electrode and the base region in the silicon substrate and the contact area level between the emitter electrode and the emitter region in the silicon substrate.

The bipolar device of the present invention has the following embodiments.

(1) A bipolar device comprises a silicon substrate including an epitaxial growth layer, a burried layer, a low-concentration p- or n-type impurity (hereinafter "impurity" is sometimes omitted) layer, a base region, and an emitter region; an emitter electrode formed in contact with the emitter region and separated from a base electrode, which is formed in contact with the base region, by a sidewall; a device isolation film formed between the base electrode and the silicon substrate and having a horizontal distance (B) from the sidewall; and a collector electrode formed in contact with the burried layer; a contact area level between the base electrode and the base region and a contact area level between the emitter electrode and the emitter region having a level difference (A) from a depth wherein no impurity is intermixed in the emitter region upto 0.1 μm, preferably in the range of 0.03 μm to 0.1 μm by removing p- or n-type impurities from the emitter region.

(2) In the above-mentioned bipolar device, the sidewall is made from a silicon oxide film, the distance B is 0.5 μm or less and preferably 0.1 μm or more, and the level difference A (μm) and the distance B (μm) have the following relationship:

$$0.03 \leq A < 1.25B^2 - 0.35B + 0.06 \qquad (1)$$

The lower limit can be changed to a depth wherein no impurity is intermixed in the emitter region.

(3) In the above-mentioned bipolar device, the sidewall is made from a silicon oxide film in contact with the level difference and a silicon film in contact with the emitter electrode, the distance B is 0.4 μm or less and preferably 0.1 μm or more, and the level difference A (μm) and the distance B (μm) have the following relationship:

$$0.03 \leq A < 7.0B^2 - 0.3B + 0.08 \qquad (2)$$

The lower limit can be changed to a depth wherein no impurity is intermixed in the emitter region.

(4) In the above-mentioned bipolar device, the sidewall is made from a silicon nitride film and a silicon oxide film, the distance B is 0.4 μm or less and preferably 0.1 μm or more, and the level difference A (μm) and the distance B (μm) have the following relationship:

$$0.03 \leq A < 0.63B^2 + 0.13B + 0.05 \qquad (3)$$

The lower limit can be changed to a depth wherein no impurity is intermixed in the emitter region.

(5) In the above-mentioned bipolar device, the sidewall is made from a silicon nitride film, the distance B is 0.4 μm or less and preferably 0.1 μm or more, and the level difference A (μm) and the distance B (μm) have the following relationship:

$$0.03 \leq A < 1.25B^2 - 0.5B + 0.1 \qquad (4)$$

The lower limit can be changed to a depth wherein no impurity is intermixed in the emitter region.

(6) In the above-mentioned bipolar device, the distance B between the sidewall and the device isolation film is 0.3 μm or less and preferably 0.1 μm or more, the sidewall is made from a silicon oxide film in contact with the level difference and a silicon film in contact with the emitter electrode, and the level difference A in terms of μm has the following relation to the distance B:

$$0.03 \leq A < 7.0B^2 - 0.3B + 0.08 \qquad (2)$$

The lower limit can be changed to a depth wherein no impurity is intermixed in the emitter region.

(7) In the above-mentioned bipolar device, the sidewall is made from a silicon oxide film, the distance B is in the range of 0.4±0.1 μm, and the level difference A is in the range of 0.03 μm to 0.06 μm.

(8) In the above-mentioned bipolar device, the sidewall is made from a silicon oxide film preferably in contact with the level difference and a silicon film preferably in contact with the emitter electrode, the distance B is in the range of 0.2±0.1 μm, and the level difference A is in the range of 0.03 μm to 0.1 μm.

(9) In the above-mentioned bipolar device, the sidewall is made from a silicon oxide film and a silicon nitride film, the distance B is in the range of 0.3±0.1 μm, and the level difference A is in the range of 0.03 to 0.1 μm.

(10) In the above-mentioned bipolar device, the sidewall is made from a silicon nitride film, the distance B is in the range of 0.4±0.1 μm, and the level difference is in the range of 0.03 to 0.06 μm.

According to the present invention, the problem of easily changeable electric characteristics caused by contamination with a reverse conductivity type impurity on the surface of the emitter region can be solved by slightly removing the emitter region so as to make a proper level difference (A) at the contact area level between the base electrode and the base region in the silicon substrate and the contact area level between the emitter electrode and the emitter region in the silicon substrate. The contamination of the emitter region with the reverse conductivity type impurity mainly takes place at the time of deposition of an interlaminar insulating film after the deposition of base electrode containing the reverse conductivity type impurity such as boron in high concentration (e.g. upto $10^{20}$ atom/cm$^3$).

Since heating at high temperatures is required at the deposition of the interlaminar insulating film, the reverse conductivity type impurity contained in the base electrode diffuse into a portion which becomes the emitter region later. The impurity penetrates from the surface of silicon substrate into the inner portion thereof. Thus, by removing only the emitter region from the surface of silicon substrate so as to take away the area where the reverse conductivity type impurity have been penetrated and by forming the level difference, it becomes possible to suppress changes in electric characteristics.

But when the size of level difference becomes too large, the stress at an end portion of the sidewall in contact with the silicon substrate increases so as to generate dislocation, resulting in deteriorating the electric characteristics of bipolar device. Therefore, it is necessary to limit the level difference A in the range of 0.03 μm to 0.1 μm.

According to the study of the present inventors, as a factor for deciding the stress at the end portion of the sidewall in contact with the silicon substrate, there is an influence of stress field of compression stress caused by oxidation stress possessed by the device isolation fill (thermal oxidation film). When the layout is reduced and the horizontal distance B from the device isolation film to the sidewall is reduced so as to realize high integration, since the stress field caused by the thermal oxidation film approaches the sidewall, the stress at the end portion of sidewall in contact with the silicon substrate increases so as to easily bring about dislocation. If the reduction of distance between the device isolation film and the sidewall is necessary for realizing high integration, it becomes necessary to limit other parameters.

Further, since the sidewall is bound by the base electrode and the interlaminar insulating film, bending stress is generated at another end portion of the sidewall by making the end portion of the sidewall having a right angle a fulcrum. This bending stress increases with an increase of the size of level difference A. Therefore, by limiting the size of the level difference to a certain range, the stress at the end portion of sidewall in contact with the silicon substrate can be suppressed low. That is, according to the above-mentioned means, since resolved shear stress can be lowered at the area in the silicon substrate wherein stresses in the bipolar device are focused, that is, at the end portion of the sidewall which separates the emitter electrode and the base electrode, the generation of dislocation at the end portion of sidewall in contact with the silicon substrate can be prevented.

Further, as a factor deciding the stress at an end portion of the sidewall, there is an internal stress possessed by the sidewall. The internal stress of sidewall per se (a combination of thermal stress and intrinsic stress) generates a stress at an end portion of the sidewall, that is, at the interface of different materials of the sidewall and other portion. Thus, by properly selecting the material for sidewall, it is possible to reduce the resolved shear stress at the end portion of the sidewall in contact with the silicon substrate. By constructing the sidewall with a material such as silicon nitride, silicon oxide, silicon, a combination thereof, which can reduce the internal stress, it is possible to suppress the resolved shear stress at the end portion of the sidewall in contact with the silicon substrate lower than the dislocation generating critical stress.

On the other hand, when the level difference A is too small, since the removal of the contaminated reverse conductivity type impurity is insufficient, the electric characteristics become unstable. As mentioned above, when the level difference A is too large, dislocation takes place to worsen the electric characteristics. Therefore, by forming the level difference in a proper range so as to remove the reverse conductivity type impurity and to prevent the generation of dislocation, that is, from a depth wherein no impurity is intermixed in the emitter region upto 0.1 μm, preferably in the range of 0.03 μm to 0.1 μm, there can be obtained the bipolar device small in leakage current even if the integration of semiconductor device is increased, and good in electric characteristics.

Such a bipolar device can be produced by the steps of:

forming a burried layer on a silicon substrate, followed by formation of a low-concentration p- or n-type layer, forming a device isolation layer on the silicon substrate by thermal oxidation, depositing a base electrode and an interlaminar insulating film on a base region in the silicon substrate, forming an opening by partly removing the base electrode and the interlaminar insulating film, followed by removal of the silicon substrate in the opening in a predetermined amount so as to form a level difference finally, and formation of a genuine base layer by ion implantation or thermal diffusion method, forming a sidewall at a side wall, forming an outer base layer as an impurity source in the silicon substrate by heat treatment, forming an emitter region on the base region by ion implantation and subsequent heat after the formation of a polycrystalline silicon film, forming an emitter electrode on the emitter region, and forming a collector electrode in contact with the burried layer.

In the above-mentioned process, it is preferable to use as parameters the horizontal distance (B) between the sidewall and the device isolation film, the internal stress and Young's modulus of the material of sidewall, and/or the level difference (A) of the contact area level between the base electrode and the base region in the silicon substrate, and the contact area level between the emitter electrode and the emitter region in the silicon substrate for obtaining shear stress in the glide direction on the glide plane in the silicon substrate by numerical analysis (analysis by the finite element method) and for making the individual parameter values lower than the dislocation generating limit.

The present invention is explained more in detail referring to drawings.

Figure 2:
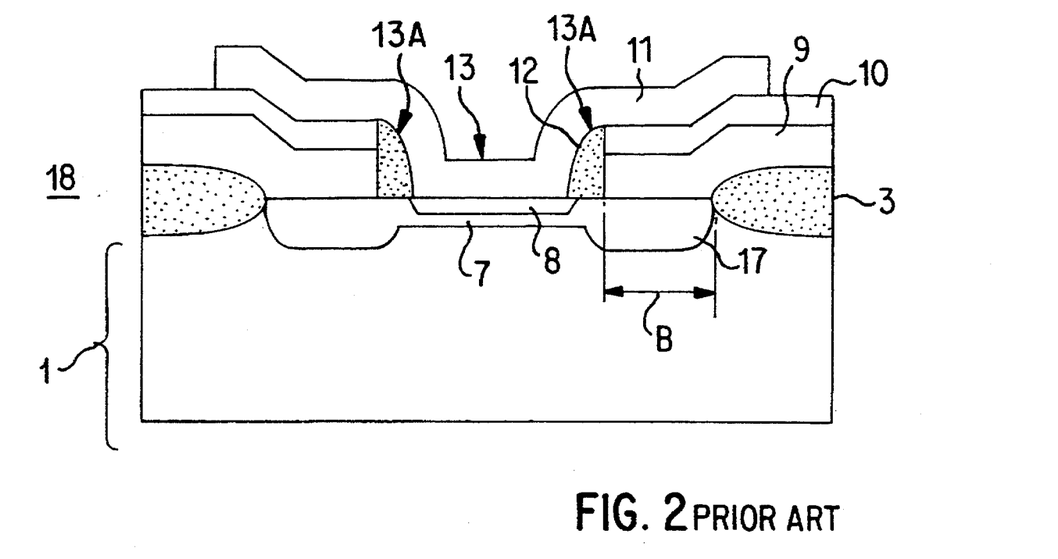
FIG. 2 is a crosssectional view of main portions of a bipolar device of prior art.
Figures 12, 13:
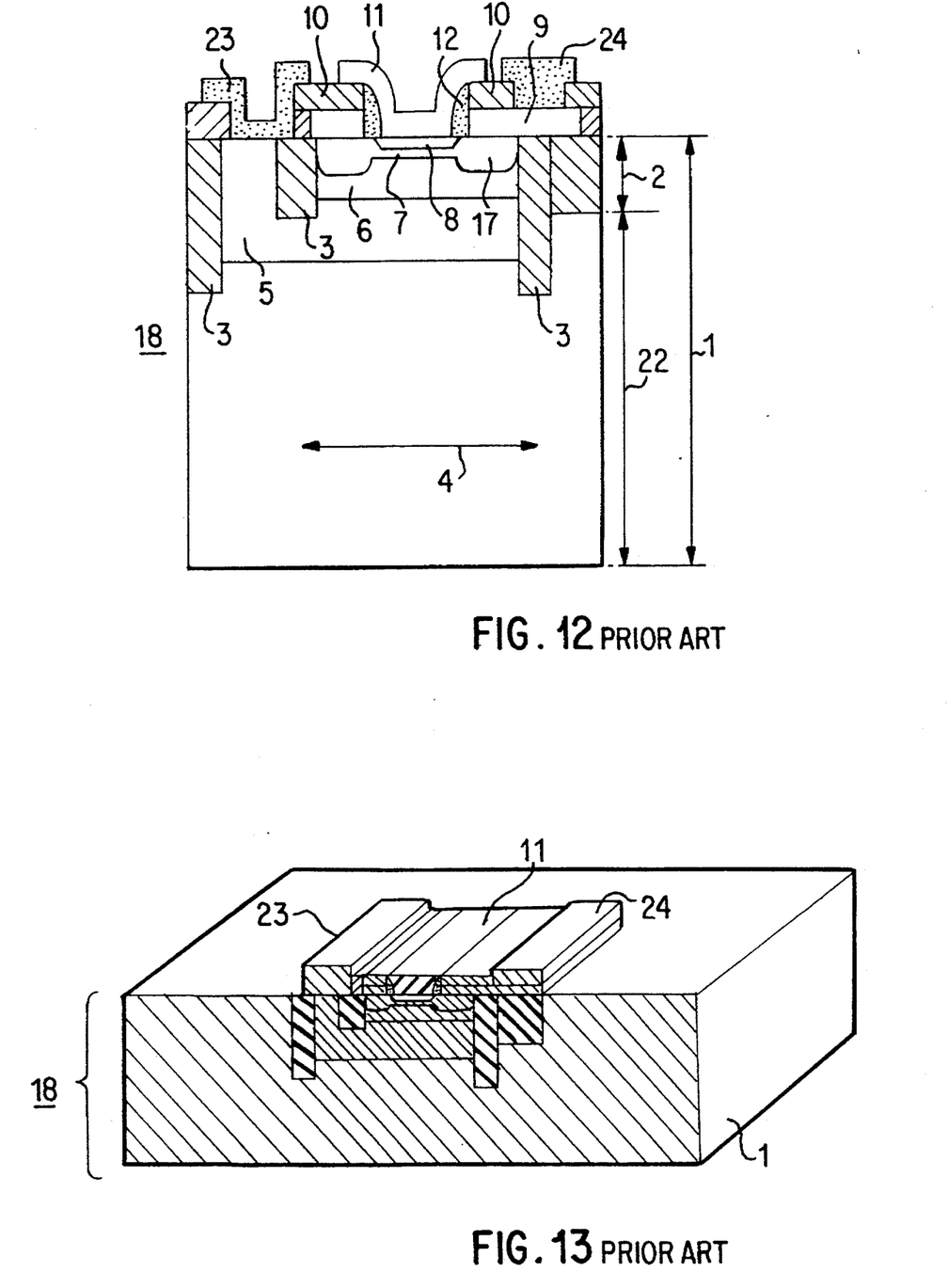
FIG. 12 is a crosssectional view of main portions of a bipolar device according to prior art.
FIG. 13 is a schematic and partially cross-sectional view of the bipolar device.

FIG. 12 is an enlarged crosssectional view of main portions of a bipolar device of prior art, wherein numeral 18 denotes a bipolar device, numeral 22 denotes a bottom portion of silicon substrate of a reverse conductivity type, numeral 1 denotes a silicon substrate, numeral 2 denotes an epitaxial growth layer of a reverse conductivity type, numeral 3 denotes a device isolation film, numeral 4 denotes an active area, numeral 5 denotes a monoconductivity type high concentration burried layer, numeral 6 denotes a monoconductivity low concentration layer, numeral 7 denotes a base region of a reverse conductivity type, numeral 8 denotes an emitter region of a monoconductivity type, numeral 9 denotes a base electrode containing a reverse conductivity type impurity in high concentration, numeral 10 denotes an interlaminar insulating film, numeral 11 denotes an emitter electrode, numeral 12 denotes a sidewall made from a silicon oxide film, numeral 17 denotes an outer base region of a reverse conductivity type, numeral 23 denotes a collector electrode, and numeral 24 denotes a base wiring. Hereinafter, the silicon substrate 1 can include all of the epitaxial growth layer 2, the high concentration buried layer 5, the low concentration layer 6, the base region 7, the emitter region 8, and the outer base region 17. FIG. 2 is an enlarged crosssectional view of the active area which is a major portion of the bipolar device. FIG. 13 is a schematic and partially crosssectional view of a bipolar device. The crosssectional portion of FIG. 13 corresponds to each crosssection of FIG. 12 and other drawings hereinafter referred to.

The active area in the bipolar device shown in FIG. 2 can be formed as follows. First, a base electrode 9 containing a reverse conductivity type impurity (e.g. boron, etc.) in high concentration (e.g. $10^{20}$ atom/cm$^3$) and an interlaminar insulating film 10 (e.g. a silicon oxide film) are deposited on the surface of silicon substrate 1 in the active area 4, followed by selective removal of the base electrode 9 and the interlaminar insulating film 10 using a conventional photoresist film as a mask to form an opening.

After depositing a silicon oxide film further, a sidewall 12 made from the silicon oxide fill is formed at a side wall of the opening. Then, while using as a mask the sidewall 12 and the interlaminar insulating film 10, a reverse conductivity type impurity (e.g. boron upto $10^{12}$/cm$^2$ (dose)) and subsequently a monoconductivity type impurity (e.g. arsenic upto $10^{16}$/cm$^2$ (dose)) are implanted by ion implantation. Then, the heat treatment is conducted to form a base region 7 and an emitter region 8, followed by formation of an emitter electrode 11 so as to contact with the emitter region 8.

In the above-mentioned process, there was a problem in that electric characteristics are easily changed due to contamination of a reverse conductivity type impurity in addition to the monoconductivity impurity constituting the emitter region 8 on the surface thereof.

Figure 1:
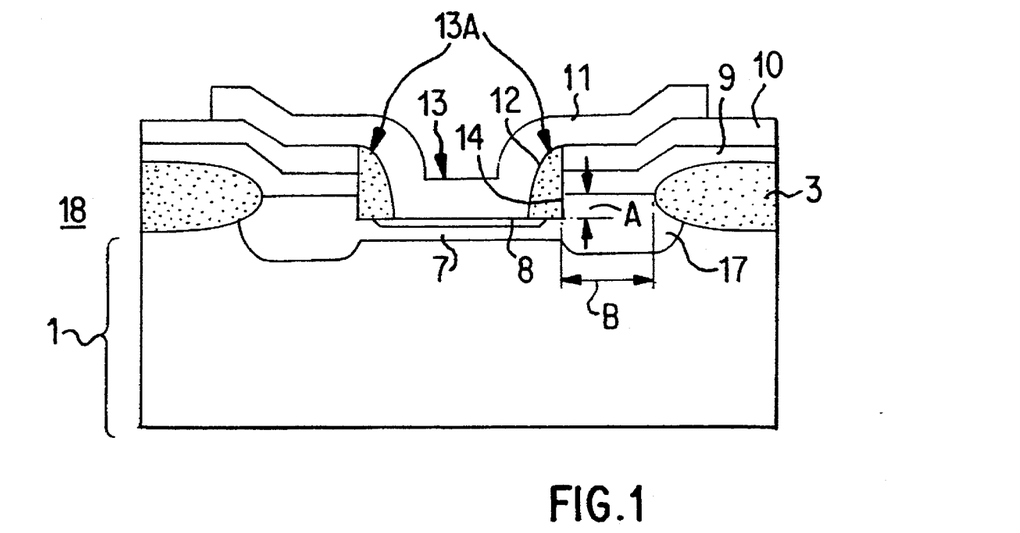
FIG. 1 is a crosssectional view of main portions of a bipolar device obtained in Example 1.

The present inventor found that when the size of the bipolar device 18 as shown in FIG. 1 was reduced and the distance B between the sidewall 12 and the device isolation film 3 was made 0.4 μm or less in order to improve the integration of device, a number of defective devices were produced wherein current leakage between the emitter and the collector was abnormally increased. By the analysis using a transmission electron microscope, it was found that dislocation was generated in the silicon substrate 1 starting from an end of the sidewall 12, and this traversed the emitter and the collector to generate current leakage. It is known that dislocation is generated when the shear stress component (resolved shear stress component) on the {111} crystal plane of silicon crystal is above the critical value. In order to prevent the generation of dislocation in the internal portion of the bipolar device 18 and to make electric characteristics of bipolar device better, it is necessary to suppress the resolved shear stress component in the silicon substrate 1 below the critical value.

Further, individual sizes of bipolar device 18 are reduced in order to improve the integration of the bipolar device 18, there is a tendency to easily generate dislocation, since stress concentrated fields caused by residual stress of each thin film are multiplied to enlarge the stress. Thus, it is necessary to provide a bipolar device having a structure not to make the generated stress too large, even it the integration of the bipolar device 18 is improved.

The above-mentioned problem can be solved by making the contacting portion between the emitter electrode 11 and the emitter region in the silicon substrate 1 properly lower than the contacting plane between the base electrode 9 and the base region in the silicon substrate 1. That is, by making a level difference A 14 having a proper size between the contact area of the base electrode 9 and the silicon substrate 1 and the contacting area of the emitter electrode 11 and the silicon substrate 1, solving the problem becomes possible. The term "silicon substrate 1" includes the epitaxial growth layer, the high concentration buried layer, the low concentration layer, the base region 7 and the emitter region 8.

Figure 3:
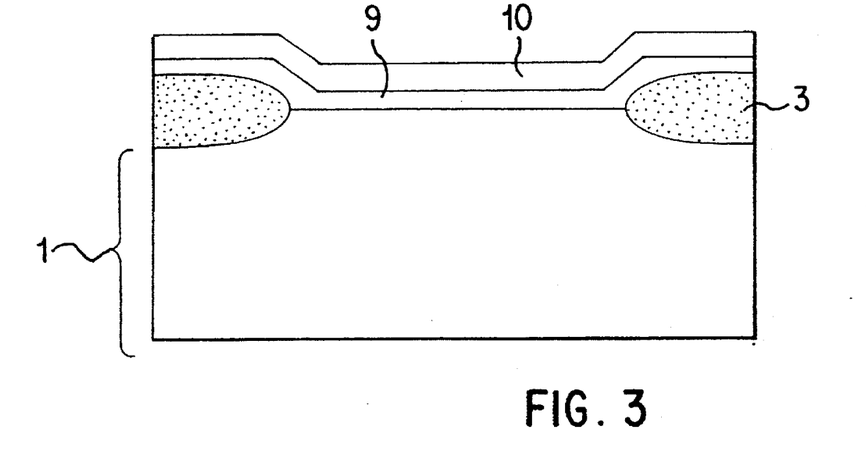
FIG. 3 is a crosssectional view of a silicon substrate in the course of production of a bipolar device for explaining problems of the bipolar device.

The problem of easily changing the electric characteristics caused by contamination of the surface of the emitter region 8 with the reverse conductivity type impurity can be resolved by slightly removing the emitter region and forming the level difference 14 in a proper size between the contact area of the base electrode 9 and the silicon substrate 1 and the contact area of the emitter electrode 11 and the silicon substrate 1. The contamination of the emitter region with the reverse conductivity type impurity takes place at the time of deposition of the interlaminar insulating layer 10 after the deposition of the base electrode 9 containing the reverse conductivity type impurity in high concentration as shown in FIG. 3.

Since heating at a temperature of about 600° C. to 900° C. is necessary for depositing the interlaminar film 10 (e.g. silicon oxide film), the reverse conductivity type impurity contained in the base electrode 9 diffuses into the portion which becomes the emitter region 8 later. This impurity diffuses from the surface of the silicon substrate 1 and penetrates into the inner portion. Thus, only the emitter region is removed from the surface of silicon substrate 1, for example by etching, so as to eliminate the area contaminated with the reverse conductivity type impurity and to form the level difference 14, resulting in suppressing the change in electric characteristics.

But, the formation of the level difference 14 simply is not sufficient. When the size of the level difference 14 is too large, the stress at the end of sidewall 12 in contact with the silicon substrate increases to generate dislocation, resulting in deteriorating electric characteristics of the bipolar device 18. Therefore, it is necessary to limit the level difference in the range of 0.03 to 0.1 μm.

In order to reduce the stress at the end portion of the sidewall in contact with the silicon substrate, the present inventors also investigated mechanisms for generating the stress using numerical calculations. As a factor for deciding the stress at the end portion of sidewall 12 in contact with the silicon substrate, there is an influence of the stress field of compression stress caused by oxidation stress possessed by the device isolation film (thermal oxidation film) 3.

On the other hand, the method of stress analysis can be carried out as follows. As parameters, the distance B between the sidewall and the device isolation film, the internal stress and Young's modulus of the material for the sidewall, and the level difference A between the contact area level of the base electrode and the silicon substrate, and the contact area level of the emitter electrode and the silicon substrate are measured. Then, the shear stress in the glide direction in the glide plane in the silicon substrate is subjected to numerical analysis (analysis by the finite element method).

The thus obtained shear stress can be expressed in a stress distribution chart (or diagram) using at least the distance between the sidewall and the device isolation film as a parameter.

According to the present invention, there is also provided an information communicating and maintaining means which has a display device relating to the structure of the bipolar device mentioned above, and is a medium such as paper, magnetic disc, optical disc, magnetooptical disc, etc., wherein at least the distance between the sidewall and the device isolation film, the internal stress and Young's modulus of material for the sidewall, and the level difference between the contact area level of the base electrode and the silicon substrate, and the contact area level of the emitter electrode and the silicon substrate are written as parameters, and the area wherein dislocation is estimated to generate is indicated.

The present invention is illustrated by way of the following Examples referring to attached drawings wherein FIGS. 1, 3, 4, 5 and 8 are enlarged crosssectional views showing the structure of the active area 4 of bipolar device of the present invention.

EXAMPLE 1

FIG. 1 is a crosssectional view of main portions of a bipolar device 18. In FIG. 1, numeral 1 denotes a silicon substrate, numeral 3 denotes a device separation film, numeral 7 denotes a base region of a reverse conductivity type, numeral 8 denotes an emitter region of monoconductivity type, numeral 9 denotes a base electrode containing a reverse conductivity type impurity in high concentration, numeral 10 denotes an interlaminar insulating film, numeral 11 denotes an emitter electrode, and numeral 12 denotes a sidewall made from a silicon oxide film. The base electrode 9 is placed contacting with the device isolation film 3. The emitter region 8 is separated from the base region 7 by the sidewall 12.

As shown in FIG. 1, the bipolar device has a structure wherein the level difference 14 is present between the contact area of the emitter electrode 11 with the silicon substrate 1, and the contact area of the base electrode 9 with the silicon substrate 1, in other words, the contact area of the emitter electrode 11 with the silicon substrate 1 is removed. As the silicon substrate 1, it is possible to use a substrate having a silicon on insulator (SOI) structure. When a substrate having SOI structure is used, there is a tendency to increase stress at individual portions. In such a case, the present invention is particularly effective.

The device isolation film 3 is constituted by a silicon oxide film, preferably thermally oxidized film. The base electrode 9 and the emitter electrode 11 are constituted by a conductive film, preferably made from a polycrystalline silicon film, a tungsten film, a tungsten-silicide film, a single crystal silicon film, or amorphous silicon film. The interlaminar insulating film 10 is made from either a silicon oxide film or a silicon nitride film. The sidewall 12 is made from a silicon oxide film, preferably that formed by a chemical vapor deposition (CVD) method using an inorganic silane as a raw material.

The bipolar device 18 is produced as follows. First, on the surface of an active area 4 shown in FIG. 4, the base electrode 9 (polysilicon) containing a reverse conductivity type impurity (boron) in high concentration (about $10^{20}$/cm$^3$) and the interlaminar insulating film (silicon oxide) 10 are deposited. Then, the base electrode 9 and the interlaminar insulating film 10 are selectively removed using a photoresist film as a mask to form an opening 13. Then, the silicon substrate 1 containing impurities upto $10^{15}$/cm$^3$ at the opening 13 is locally etched to form a level difference 14.

Figure 4:
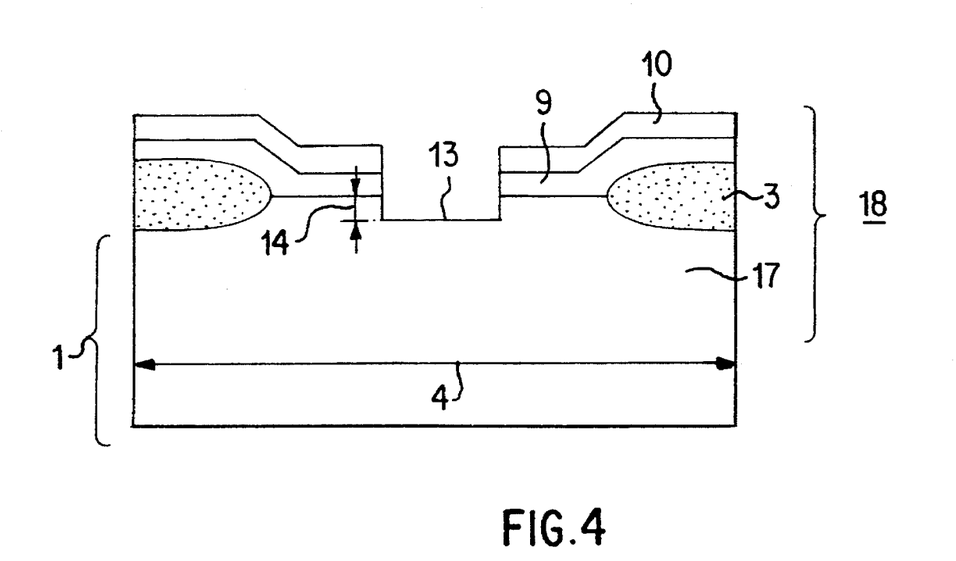
FIG. 4 is a crosssectional view of main portions for explaining the producing process of bipolar device according to Example 1 of the present invention.

The size of the level difference 14 is determined so as to remove the reverse conductivity impurity from the silicon substrate surface and so as not to generate dislocation in the range of 0.03 μm to 0.1 μm. Then, a reverse conductivity type impurity (boron, upto $10^{12}$/cm$^2$) was implanted into the opening by a thermal diffusion method or ion implantation method to form a part of base region (genuine base region).

Figure 5:
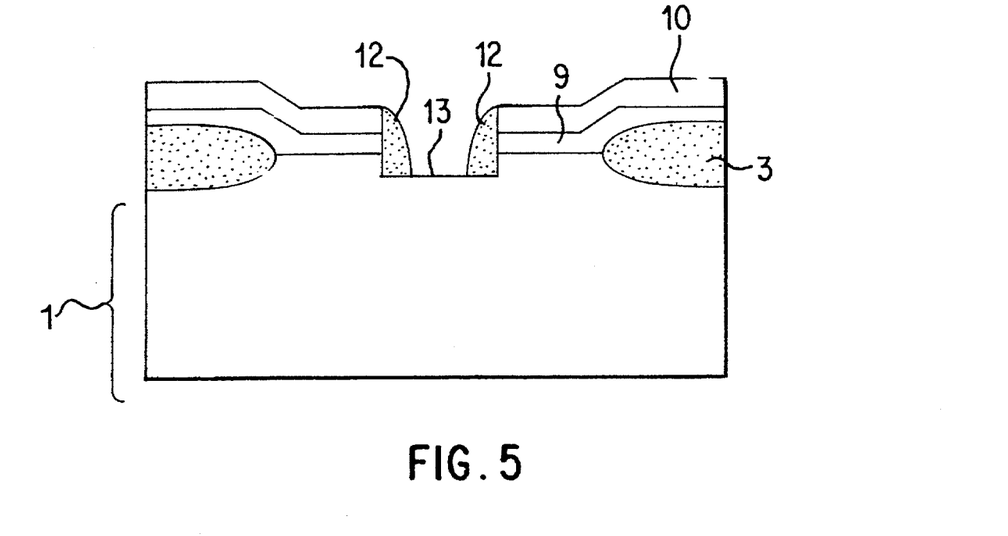
FIG. 5 is a crosssectional view of main portions for further explaining the producing process of bipolar device according to Example 1 of the present invention.

After depositing a silicon oxide film, a sidewall 12 made from a silicon oxide film is formed at a side wall of the opening 13 by etching back as shown in FIG. 5. Then, a heat treatment was conducted to diffuse the base electrode 9 containing the reverse conductivity type impurity as an impurity source and to form a part of base region (outer base region). After depositing a silicon film uniformly, using the sidewall 12 and the interlaminar insulating film 10 as a mask, a monoconductivity type impurity (arsenic, phosphorus, etc. upto $10^{16}$/cm$^2$) are implanted in the opening by ion implantation. Then, the emitter region 8 as shown in FIG. 1 are formed by heat treatment. Further, by etching the silicon film, the emitter electrode 11 is formed in contact with the emitter region 8.

In the above-mentioned process, when the interlaminar insulating film 10 is deposited after the deposition of the base electrode 9 containing the reverse conductivity type impurity in high concentration as shown in FIG. 3, the emitter region is contaminated with the reverse conductivity type impurity. The presence of such an impurity cannot be ignored with an improvement of integration of the bipolar device. That is, with an improvement of integration, the stress value at each stress concentration field increases. By the presence of such a stress field, these impurities are captured and become to show a distribution depending on the stress field.

Further, with the reduction of size in the width direction of the device, the distribution has influenced on properties of the device. Thus, the removal of the impurity intermixed at the time of deposition of the interlaminar insulating film 10 (see FIG. 1) is inevitable for the bipolar device wherein the distance B from the sidewall 12 to the device isolation film 3 is 0.4 μm or less. For example, when the interlaminar insulating film 10 is deposited at about 600° C. to 900° C. and as the base electrode 9 polysilicon containing a large amount of boron is used, the boron diffuses 0.03 μm in depth at maximum during the deposition of the interlaminar insulating layer 10. In order to remove this reverse conductivity type impurity, it is necessary to remove the silicon substrate in 0.03 μm or more so as to form the level difference 14.

When the level difference 14 was formed deeper than the peak concentration depth of the reverse conductivity type impurity in the base region 7, and a bipolar device 18 was produced by simply reducing the size in the width direction, dislocation was generated from the end portion of the sidewall 12 in contact with the silicon substrate very often, resulting in failing to produce the bipolar device 18 having good electric characteristics. This means that the resolved shear stress at the end portion of sidewall 12 in contact with the silicon substrate is beyond the dislocation generating critical stress.

The resolved shear stress at the end portion of sidewall 12 in contact with the silicon substrate is greatly influenced by three parameters, that is, physical properties of the material for the sidewall 12, the size A of the level difference 14 between the contact area of the base electrode 9 with the silicon substrate 1 and the contact area of the emitter electrode 11 with the silicon substrate 1, and the distance B from the device isolation film 3 to the sidewall 12. That is, the device isolation film 3 is formed by thermal oxidation of the silicon substrate. Since the volume expansion of 1.25 times takes place at this time, there is generated a large compressive residual stress. Therefore, with a decrease of the distance from the device isolation film 3 to the sidewall 12, the influence of compressive stress of the device isolation film 3 becomes remarkable and the resolved shear stress at the end portion of the sidewall 12 in contact with the silicon substrate increases.

Further, the material such as silicon oxide constituting the sidewall 12 has a higher Young's modulus, a large intrinsic stress generated at the time of film formation, and provides a larger strain to the silicon substrate when the shrinkage after heat treatment is larger, so that the resolved shear stress generated at the end portion of sidewall 12 in contact with the silicon substrate increases. Further, when the size of the level difference 14 is larger, the bending stress generated at another end of the sidewall 12 increases when the end portion of the sidewall 12 having a right angle is taken as a fulcrum.

Figure 6:
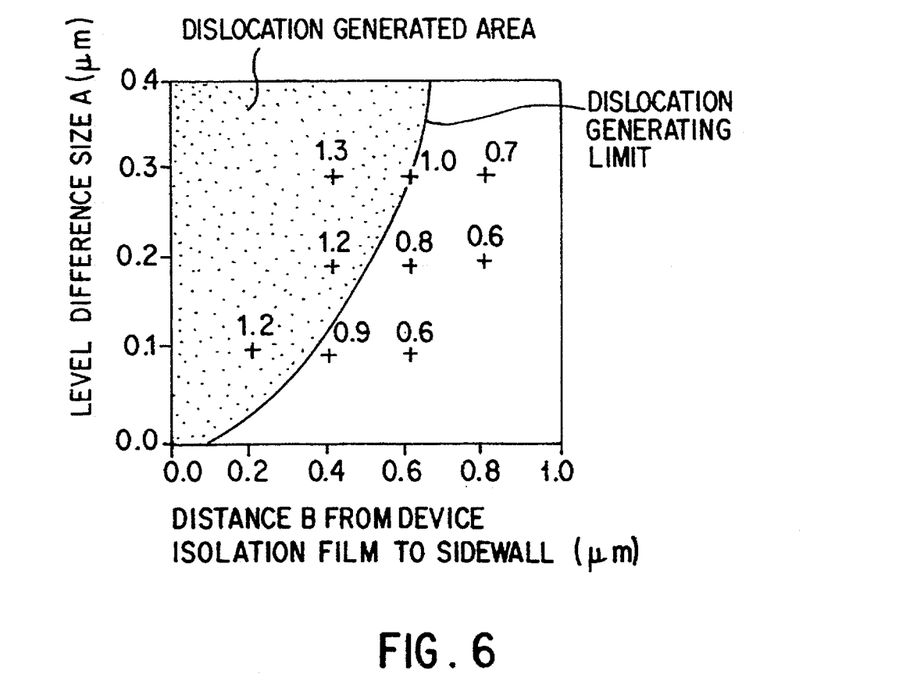
FIG. 6 is a diagram showing a dislocation generating area explaining a structure not generating dislocation.

Thus, when the stress analysis is conducted by the finite element method using these parameters and compared with the dislocation generating critical stress, optimization can be attained. FIG. 6 shows resolved shear stress values at end portion of sidewall 12 in contact with the silicon substrate when taken the level difference A along the ordinate axis and the distance B from the device isolation film 3 to the sidewall 12 along the abscissae axis in the case of forming the sidewall 12 by silicon oxide using inorganic silane as a raw material and the CVD method.

In FIG. 6, the stress values are shown by the rated values taking the dislocation generating critical stress as 1. The dislocation generating limit can be expressed by a quadratic equation using the above-mentioned A (μm) and B (μm) as follows:

$$A = 1.25B^2 - 0.35B + 0.06 \qquad (1)$$

When the upper limit of the level difference 14 was decided so as to be outside the dislocation generating area, no dislocation at the end portion of sidewall 12 in contact with the silicon substrate took place and bipolar devices having good electric characteristics were produced.

For example, when the distance B from the device isolation film 3 to the sidewall 12 was taken in the range of 0.4±0.1 μm taking the production deviation into consideration, and the level difference A was taken in the range of 0.03 μm to 0.06 μm also taking the production deviation into consideration, good bipolar devices were obtained. When the size of bipolar devices 18 was reduced in 20% and the size of level difference 14 was determined so as to be outside the dislocation generating limit shown by the above equation (1), the resulting bipolar devices did not generate dislocation and showed good electric characteristics, even if the bipolar devices were reduced in size to attain higher integration of semiconductor devices.

Figure 7:
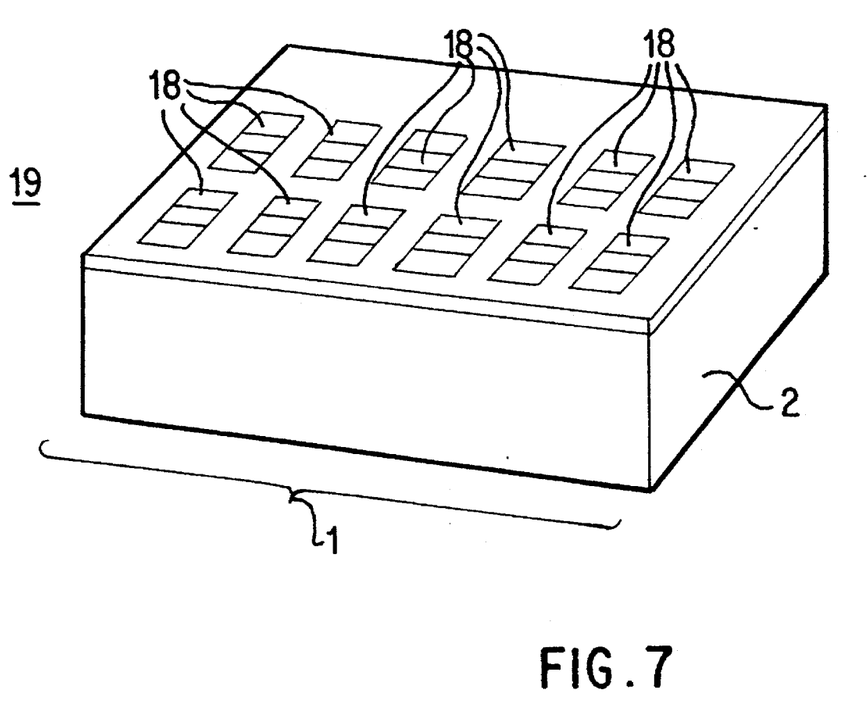
FIG. 7 is a schematic view showing a relation between each bipolar device and a semiconductor device.

FIG. 7 shows a semiconductor device 19 mounting a large number of bipolar devices 18 on a silicon substrate 1. Even one of the bipolar device on the semiconductor device 19 brings about dislocation, the behavior of the semiconductor device 19 becomes incomplete. Therefore, all the bipolar devices 18 on the semiconductor device 19 should have the level difference 14 in the predetermined range (e.g. 0.03 μm to 0.1 μm) so as to prevent the generation of dislocation completely.

When the level difference 14 is formed in bipolar devices, since there is a deviation in the etching speed in the semiconductor device 19, there can easily be formed the level difference 14 larger than the predetermined size in some bipolar devices 18 due to faster etching speed at the completion of the etching of all the bipolar devices in the semiconductor device 19. Therefore, even if the size of the level difference 14 may vary in the semiconductor device 19, such a deviation should be limited to the range not generating the dislocation.

EXAMPLE 2

The process of Example 1 was repeated except for using an organic silane in place of the inorganic silane for forming the sidewall 12 with a silicon oxide film by CVD method. The sidewall was contaminated with a trace amount of carbon atoms.

As a result, bipolar devices having the same good electric characteristics as in Example 1 were obtained.

EXAMPLE 3

Figure 8:
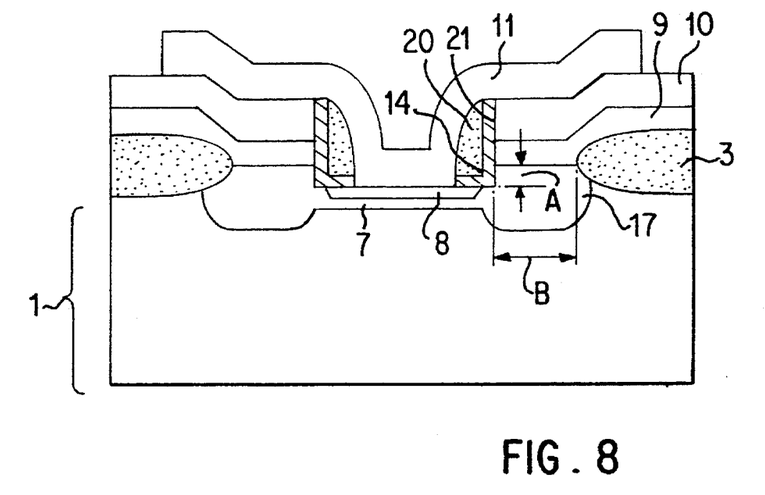
FIG. 8 is a crosssectional view of main portions of a bipolar device according to Example 3 or Example 4 of the present invention.

FIG. 8 shows another example of the bipolar device (main portions being shown) wherein the sidewall comprises an upper sidewall 20 made from a silicon film and a lower sidewall 21 made from a silicon oxide film. The lower sidewall 21 is constructed by a silicon oxide film, preferably by using an inorganic silane as a main starting material using the CVD method. The upper sidewall 20 is constructed by polycrystalline silicon, amorphous silicon or single crystal silicon obtained by using a silane as a starting material and the CVD method. The thickness of the lower sidewall 21 is preferably in the range of 0.03 μm to 0.08 μm.

Figure 9:
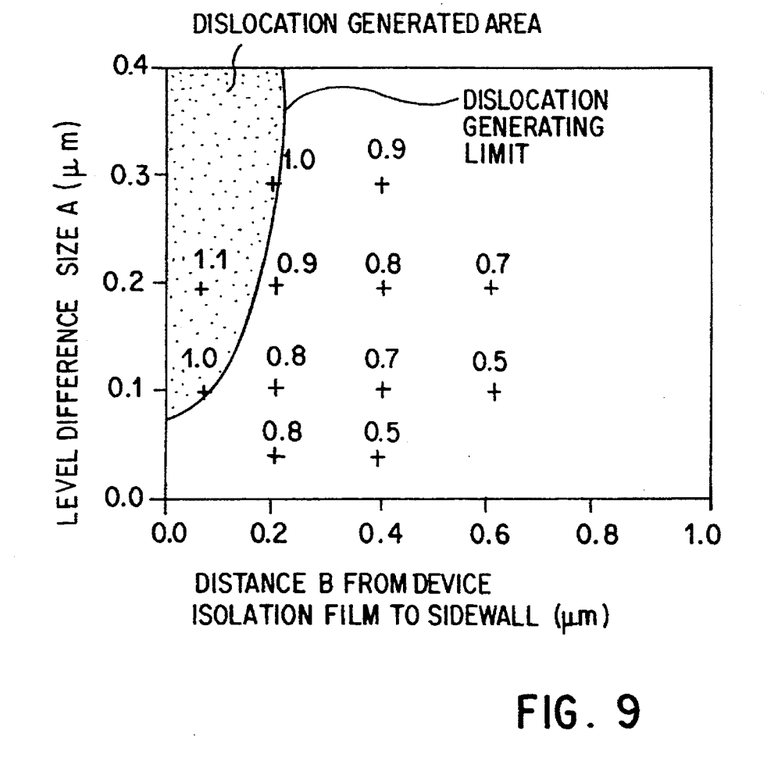
FIG. 9 is a diagram showing a dislocation generating area explaining a structure not generating dislocation.

FIG. 9 shows resolved shear stress values at the end portion of sidewall in contact with the silicon substrate when taken the level difference A along the ordinate axis and the distance B from the device isolation film 3 to the sidewall along the abscissae axis. FIG. 9 shows ratios to the dislocation generating critical stress comparing the resolved shear stress at the end portion of each level difference 14 with the dislocation generating critical stress as in Example 1.

The level difference A (μm) has the following relation to the distance B (μm):

$$A < 7.0B^2 - 0.3B + 0.08 \qquad (2)$$

By deciding the size of the level difference using the above equation, the generation of dislocation can be prevented. Further, by making the level difference 14 0.03 μm or more so as to remove the reverse conductivity type impurity other than the monoconductivity type impurity constituting the emitter region 8, the variation of electric characteristics can be prevented.

For example, when the distance B from the device isolation film 3 to the sidewall was taken in the range of 0.2±0.1 μm taking the production deviation into consideration, and the level difference A was taken in the range of 0.03 μm to 0.1 μm from FIG. 9 also taking the production deviation into consideration, good bipolar devices were obtained.

According to the present invention, the sidewall comprises a portion of the silicon oxide film in contact with the level different portion, and a portion of the silicon film in contact with the emitter electrode. That is, since the interface between the emitter electrode and the sidewall does not become a different material interface, the specificity is weakened and stress concentration can be reduced. Therefore, even if high integration is conducted, the generation of dislocation can be prevented. As a result, there can be obtained the bipolar device having high reliability.

Further, by making the distance from the sidewall to the device isolation film 0.3 μm or less, since the area of base electrode on the silicon substrate can be further reduced, smaller chips can be obtained, compared with the case of making the distance from the sidewall to the device isolation film 0.4 μm or less.

EXAMPLE 4

This Example provides a further example of the bipolar device, wherein the upper sidewall 20 is made from a silicon nitride film and the lower sidewall 21 is made from a silicon oxide film (see FIG. 9). The lower sidewall 21 is constructed by a silicon oxide film, preferably by using an inorganic silane as a main starting material and the CVD method. The upper sidewall 20 is constructed by a silicon nitride film obtained by using a silane as a main starting material and the CVD method. The thickness of the lower sidewall 21 is preferably in the range of 0.03 to 0.08 μm.

Figure 10:
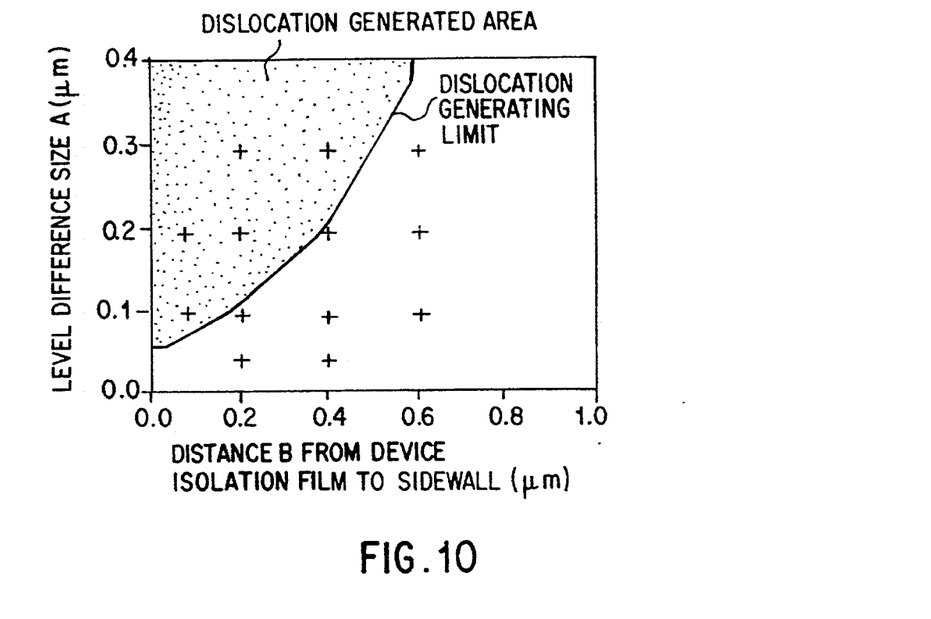
FIG. 10 is a diagram showing a dislocation generating area explaining a structure not generating dislocation.

FIG. 10 shows resolved shear stress values at the end portion of sidewall in contact with the silicon substrate when taken the level difference A along the ordinate axis and the distance B from the device isolation film 3 to the sidewall along the abscissae axis. FIG. 10 shows ratios to the dislocation generating critical stress comparing the resolved shear stress at the end portion of each level difference 14 with the dislocation generating critical stress as in Example 1.

The level difference A (μm) has the following relation to the distance B (μm):

$$A < 0.63B^2 + 0.13B + 0.05 \quad (3)$$

By deciding the size of the level difference using the above equation, the generation of dislocation can be prevented. Further, by making the level difference 14 0.03 μm or more so as to remove the reverse conductivity type impurity other than the monoconductivity type impurity constituting the emitter region 8, the variation of electric characteristics can be prevented.

For example, when the distance B from the device isolation film 3 to the sidewall was taken in the range of 0.3±0.1 μm taking the production deviation into consideration, and the level difference A was taken in the range of 0.03 μm to 0.1 μm from FIG. 10 also taking the production deviation into consideration, good bipolar devices were obtained.

EXAMPLE 5

This Example provides a still further example of the bipolar device, wherein the sidewall 12 is made from a silicon nitride film (see FIG. 1). The sidewall 12 is constituted by a silicon nitride film obtained by preferably using an inorganic silane as a main starting material and the CVD method.

Figure 11:
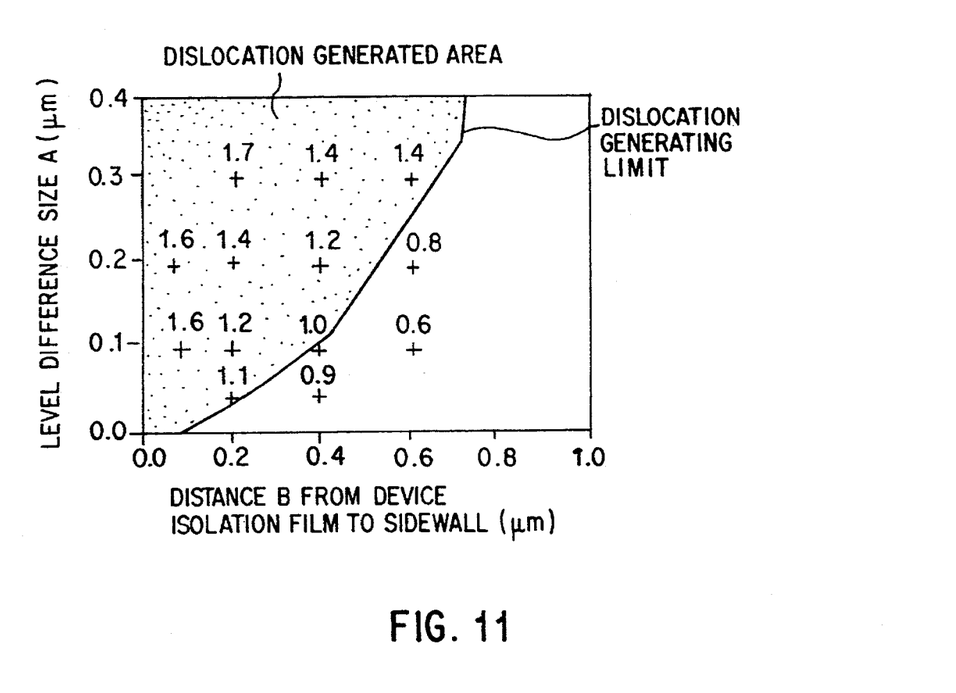
FIG. 11 is a diagram showing a dislocation generating area explaining a structure not generating dislocation.

FIG. 11 shows resolved shear stress values at the end portion of sidewall 12 in contact with the silicon substrate when taken the level difference A along the ordinate axis and the distance B from the device isolation film 3 to the sidewall along the abscissae axis. FIG. 11 shows ratios to the dislocation generating critical stress comparing the resolved shear stress at the end portion of each level difference 14 with the dislocation generating critical stress as in Example 1.

The level difference A (μm) has the following relation to the distance B (μm):

$$A < 1.25B^2 - 0.5B + 0.1 \quad (4)$$

By deciding the size of the level difference using the above equation, the generation of dislocation can be prevented. Further, by making the level difference 14 0.03 μm or more so as to remove the reverse conductivity type impurity other than the monoconductivity type impurity constituting the emitter region 8, the variation of electric characteristics can be prevented.

For example, when the distance B from the device isolation film 3 to the sidewall 12 was taken in the range of 0.4±0.1 μm taking the production deviation into consideration, and the level difference A was taken in the range of 0.03 μm to 0.06 μm from FIG. 11 also taking the production deviation into consideration, good bipolar devices were obtained.

The present invention is not limited to the above-mentioned Examples and can be practiced with various modifications. For example, when the monoconductivity type impurity is an n-type impurity and the reverse conductivity type impurity is a p-type impurity, the bipolar device becomes a npn type semiconductor device. On the other hand, when the monoconductivity type impurity is a p-type impurity and the reverse conductivity type impurity is an n-type impurity, the bipolar device becomes an pnp type semiconductor device. Further, a semiconductor substrate is not limited to a silicon semiconductor but can also be applied to a compound semiconductor.

As mentioned above, according to the present invention, since the contact area level of the emitter electrode 11 (in FIG. 1) and the silicon substrate 1 is made properly lower that the contact area level of the base electrode 9 and the silicon substrate 1, intermixture of the reverse conductivity type impurity into the emitter region 8 is prevented so as to suppress the variation of electric characteristics of the bipolar device 18, resulting in providing the bipolar device 18 having good electric characteristics.

Further, since the resolved shear stress at the end portion of the sidewall 12 in contact with the silicon substrate (see FIG. 1, etc.) which separates the emitter and the base in the silicon substrate 1, can be reduced, it is possible to obtain the bipolar device 18 slight in leakage current and having good electric characteristics.

What is claimed is:
1. A bipolar device comprising
  a silicon substrate including a collector region, a base region and an emitter region;
  a base electrode which contains a high concentration of an impurity material, and electrically contacts the base region via a contact area arranged on a surface of said base region at a first contact level within said bipolar device;
  an emitter electrode which electrically contacts the emitter region via a contact area arranged on a surface of said emitter region at a second contact level within said bipolar device and is separated from the base electrode by a side wall layer; and
  a device isolation film formed between the base electrode and the silicon substrate and separated from the side wall layer by a distance B;
  wherein said first contact level and said second contact level are separated vertically within said bipolar device by a level difference A which is in a range of from 0.03 μm to 0.10 μm.

2. A bipolar device according to claim 1, wherein the distance B between the side wall layer and the device isolation film is 0.5 μm or less, the side wall layer is made from a silicon oxide film, and the level difference A in terms of the μm had the following relation to the distance B:

$$0.35 \leq A < 1.25B^2 - 0.35 + 0.06.$$

3. A bipolar device according to claim 1, wherein the distance B between the side wall layer and the device isolation film is 0.4 μm or less, the side wall layer is made from a silicon oxide film in contact with the level difference and a silicon film in contact with the emitter electrode, and the level difference A in terms of μm has the following relation to the distance B:

$$0.03 \leq A < 7.0B^2 - 0.3B + 0.08.$$

4. A bipolar device according to claim 1, wherein the distance B between the side wall layer and the device isolation film is 0.4 μm or less, the side wall layer is made from a silicon nitride film and a silicon oxide film, and the level difference A in terms of μm has the following relation to the distance B:

$$0.03 \leq A < 0.63B^2 + 0.13B + 0.05.$$

5. A bipolar device according to claim 1, wherein the distance B between the side wall layer and the device isolation film is 0.4 μm or less, the side wall layer is made from a silicon nitride film, and the level difference A in terms of μm has the following relation to the distance B:

$$0.03 \leq A < 1.25B^2 - 0.5B + 0.1.$$

6. A bipolar device according to claim 1, wherein the distance B between the side wall layer and the device isolation film is 0.3 μm or less, the side wall layer is made from a silicon oxide film in contact with the level difference and a silicon film in contact with the emitter electrode, and the level difference A in terms of μm has the following relation to the distance B:

$$0.3 \leq A < 7.0B^2 - 0.3B + 0.08.$$

7. A bipolar device according to claim 1, wherein the distance B between the side wall layer and the device isolation film is in the range of 0.4+0.1 μm, the side wall layer is made from a silicon oxide film, and the level difference A is in the range of 0.03 μm to 0.06 μm.

8. A bipolar device according to claim 1, wherein the distance B between the side wall layer and the device isolation film is in the range of 0.2±0.1 μm, the side wall layer is made from a silicon oxide film in contact with the level difference and a silicon film in contact with the emitter electrode, and the level difference A is in the range of 0.03 μm to 0.1 μm.

9. A bipolar device according to claim 1, wherein the distance B between the side wall layer and the device isolation film is in the range of 0.3±0.1 μm, the side wall layer is made from a silicon oxide film and a silicon nitride film, and the level difference A is in the range of 0.03 μm to 0.1 μm.

10. A bipolar device according to claim 1, wherein the distance B between the side wall layer and the device isolation film is in the range of 0.4±0.1 μm, the side wall layer is made from a silicon nitride film, and the level difference is in the range of 0.03 μm to 0.06 μm.

11. A bipolar device according to claim 1, wherein the distance B between the side wall layer is made from a silicon oxide film in contact with the level difference and a silicon film in contact with the emitter electrode, and the level difference A in terms of μm has the lower limit of a depth in which no impurity is intermixed in the emitter region and has the following relation to the distance B:

$$A < 7.0B^2 - 0.3B + 0.08.$$

12. A stress analysis method for use in a bipolar device of the type comprising a silicon substrate including a collector region, a base region and an emitter region;

a base electrode which contains a high concentration of an impurity material, and electrically contacts the base region via a contact area arranged on a surface of said base region at a first contact level within said bipolar device;

an emitter electrode which electrically contacts the emitter region via a contact area arranged on a surface of said emitter region at a second contact level within said bipolar device and is separated from the base electrode by a side wall layer; and a device isolation film formed between the base electrode and the silicon substrate and separated from the side wall layer by a distance B;

wherein said first contact level and said second contact level are separated vertically within said bipolar device by a level difference A which is in a range of from 0.03 μm to 0.10 μm, said method comprising the steps of:

measuring the distance B between the side wall layer and the device isolation film, the internal stress and Young's modulus of the material for the side wall layer, and the level difference A as parameters; and subjecting shear stress in the glide direction in the glide plane in the silicon substrate to numerical analysis.

13. A stress distribution chart showing the shear stress obtained by the method of claim 12 using at least the distance B as a parameter.

14. An information containing and maintaining arrangement having a display device in conjunction with a bipolar device of the type having a silicon substrate including a collector region, a base region and an emitter region;

a base electrode which contains a high concentration of an impurity material, and electrically contacts the base region via a contact area arranged on a surface of said base region at a first contact level within said bipolar device;

an emitter electrode which electrically contacts the emitter region via a contact area arranged on a surface of said emitter region at a second contact level within said bipolar device and is separated from the base electrode by a side wall layer; and a device isolation film formed between the base electrode and the silicon substrate and separated from the side wall layer by a distance B;

wherein said first contact level and said second contact level are separated vertically within said bipolar device by a level difference A which is in a range of from 0.03 μm to 0.10 μm, said arrangement comprising a medium selected from paper, magnetic disc, optical disc and magnetooptical disc, wherein:

at least the distance between the side wall layer and the device isolation film, the internal stress and Young's modulus of material for the sidewall, and the level difference A are written as parameters, and dislocation generation estimated area is indicated.

* * * * *